United States Patent
Giordano et al.

(10) Patent No.: US 6,800,800 B1
(45) Date of Patent: Oct. 5, 2004

(54) ELECTRIC GUITAR PICKGUARD ASSEMBLY

(76) Inventors: Renato Giordano, 201 Las Flores, Aliso Viejo, CA (US) 92656; Alex Perelman, 23411 Summerfield, Apt. 18C, Aliso Viejo, CA (US) 92656; Larry Santellan, 33207 Blue Finn Dr., Dana Point, CA (US) 92629

( * ) Notice: Subject to any disclaimer, the term of this patent is extended or adjusted under 35 U.S.C. 154(b) by 38 days.

(21) Appl. No.: 10/222,168

(22) Filed: Aug. 15, 2002

Related U.S. Application Data

(60) Provisional application No. 60/312,944, filed on Aug. 15, 2001.

(51) Int. Cl.[7] .................................................. G10H 1/32
(52) U.S. Cl. .............................. 84/726; 84/728; 84/743; 84/453
(58) Field of Search ............................ 84/453, 725–728

(56) References Cited

U.S. PATENT DOCUMENTS

| | | | | |
|---|---|---|---|---|
| 4,186,641 A | * | 2/1980 | Dorfman | 84/723 |
| 4,373,417 A | * | 2/1983 | Wilson et al. | 84/743 |
| 4,539,886 A | * | 9/1985 | Hoffart | 84/267 |
| 4,711,149 A | * | 12/1987 | Starr | 84/742 |
| 4,852,443 A | * | 8/1989 | Duncan et al. | 84/733 |
| 6,014,805 A | * | 1/2000 | Buixadera Ferrer | 29/852 |
| 6,111,186 A | * | 8/2000 | Krozack et al. | 84/736 |
| 6,642,615 B2 | * | 11/2003 | Hashimoto et al. | 257/698 |
| 2001/0028105 A1 | * | 10/2001 | Hashimoto et al. | 257/686 |

* cited by examiner

*Primary Examiner*—Marlon T. Fletcher
*Assistant Examiner*—David S. Warren
(74) *Attorney, Agent, or Firm*—Drummond & Duckworth

(57) ABSTRACT

An improved electric guitar and pickguard assembly are provided. The pickguard assembly includes a traditionally shaped deck plate for mounting to the body of an electric guitar. The deck plate is constructed at least partially, or entirely, of a multi-layered printed circuit board for providing electrical pathways for communicating power and signals between electrical components mounted to the deck plate. Preferably, the deck plate's printed circuit board includes an integrated wireless transmitter and an integrated synthesizer which eliminates the need for a phantom pickup.

9 Claims, 4 Drawing Sheets

ELECTRIC GUITAR PICKGUARD ASSEMBLY

RELATED APPLICATIONS

This application is a continuation-in-part application of U.S. Provisional Application Ser. No. 60/312,944, filed Aug. 15, 2001

BACKGROUND OF THE INVENTION

The present invention relates to electric guitars. More particularly, the present invention relates to improved electronics for reducing the noise and other interference products produced by electric guitars.

Electric guitars are popular musical instruments capable of producing a wide range of sounds when used in cooperation with appropriate sound amplification devices. Moreover, the electric guitar typically includes features allowing a musician to produce acoustic response of varying volume and sound quality.

For the most part, electric guitars have changed little over the past few decades. To produce sound, guitars typically have three pickups which are positioned beneath metal strings. The pickups include one or more electrical coils which pick up the vibration of the metal strings, in a magnetic field. The electrical output of the coils is then amplified and the amplified signal is reproduced by means of a loud speaker. Typically, each pickup is composed of a single coil of wire having two ends connectable to a guitar output circuit. The pickup which is mounted nearest the string anchor is capable of picking up mostly the high frequency components of the vibrations of the metal strings. This is due to the fact that the amplitude of the vibration is reduced as the distance from the string anchor decreases. Conversely, the pickup furthest from the string anchor is capable of picking up more of the low frequency components of the string vibrations, while the pickup positioned midway picks up more of the midrange components of the string vibrations.

Since the pickups are better suited for picking up different frequency components of the mechanical vibrations of the metal strings, it is often desirable to select various combinations of the pickups in parallel for producing different musical effects. For this reason, traditional electric guitars are often provided with a five position switch which allows the selection of one of the pickups, or combinations of two adjacent pickups. Moreover, some guitars are constructed with a humbucker which is a dual coil pickup. Guitars having a humbucker pickup often include a second two position switch for placing the guitar into a single or dual humbucker mode.

Present electric guitars typically have additional circuitry for processing the electric signals produced by the pickups. The processing circuitry is used to alter qualities of the sound. For example, various ranges of notes, such as treble or bass, can be emphasized or de-emphasized. Similarly, the volume and phase of the signals can be controlled. In order to allow the guitar user to adjust the processing of the electronic signal, a guitar typically includes various knobs and buttons for controlling the various sound components including treble, bass and volume. Wires extend from the pickups to the various knobs and buttons of the processing circuitry and then ultimately to an output jack typically mounted toward the bottom of the electric guitar.

Relatively recently, guitars have been constructed to include replaceable pickguard assemblies. Pickguard assemblies include a planar structural deck plate having an outline so as to be replaceably mounted upon the face of a guitar under the guitar's strings. The deck plate is often referred to as a "pickguard". However, so as to avoid confusion herein between reference to a pickguard and pickguard assembly, the pickguard will be referred to herein simply as a deck plate.

The pickguard assembly includes various electronic components attached to the deck plate for producing the sound of the electric guitar including the pickups, five position switches, humbucker switch, and various knobs and buttons for controlling the processing circuitry. The pickguard assembly further includes the wires which connect the pickups, switches and processing circuitry. Furthermore, the pickguard assembly typically includes an output jack mounted to the deck plate. The output jack is also connected by electrical wires to the processing circuitry. Thus, all of the electronic components of the guitar are mounted on a single replaceable structure of the pickguard assembly. Replacement of a failed electronic component, or otherwise desired substitution of an electrical component, can be rapidly effected by replacement of the pickguard assembly.

Unfortunately, all of the aforementioned guitar structures require routing of a significant amount of wiring between components. This wire harness is terribly susceptible to electrical interference caused by electric motors, neon signs, transformers, electrical appliances, and even the human body which can cause noise, hum and other unwanted sounds to be produced by the electric guitar. Even when the wires are shielded, the guitar electronics are not impervious to noise being introduced into the guitar system. Moreover, shielding can produce a small capacitor effect which alters the tone of the guitar and tends to cut off the high end of the sound spectrum. In addition, increased lengths of the wire connections cause increased degradation of the sound produced by the guitar.

There is thus a significant need for an improved guitar construction which improves sound quality and reduces unwanted noise produced by the guitar.

SUMMARY OF THE INVENTION

Briefly, and in general terms, the present invention addresses the aforementioned disadvantages by providing an electric guitar having a pickguard assembly incorporating a multi-layered printed circuit board for purposes of eliminating the traditional wire harness of an electric guitar.

The electric guitar, or similar stringed instrument of the present invention, includes a traditionally shaped deck plate. The deck plate is constructed at least partially, or entirely, of a multi-layered printed circuit board provided with predetermined electrical pathways, also known in the art as traces. The printed circuit board may be mounted on a wooden or plastic deck plate of the prior art. However, preferably, the printed circuit board is integrated into the deck plate, or otherwise forms the deck plate.

The deck plate includes at least one hole for mounting a pickup. Preferably, the deck plate includes three holes positioned in a traditional configuration for mounting three pickups, including one or more humbucker pickups if desired. The deck plate may also include one or more additional holes for placement of various audio processing controls such as volume or tone potentiometers. The processing controls are mounted to the back of the deck plate with buttons or rotating shafts of the controls projecting through the deck plate holes for manual manipulation by a user from the front of the deck plate. In addition, the deck plate may include additional holes or slots for placement of switch assemblies for controlling various functions of the electrical guitar, including selection of individual or combinations of pickups for producing desired sound.

The pickguard assembly's deck plate further includes a plurality of electrical contacts, also often referred to as solder joints, for electrically connecting the various pickups, signal processing components and switches to the printed circuit board. Preferably, the electrical contacts are positioned as close as possible to the electrical components to reduce the chance of noise being introduced into the circuit. Also preferably, any wires which are used to connect the components to the printed circuit board are shielded by shielding connected to a printed circuit board ground plane. Further, preferably, the printed circuit board includes one or more notch filters electrically connected between the pickups and audio processing controls to eliminate signals below 50 or 60 hertz. Inducted noise, typically between 50 or 60 hertz is often introduced into traditional electric guitar constructions by sources near the instrument. Meanwhile, the pickguard assembly of the present invention eliminates this noise as each pickup output signal is sent to a notch filter to eliminate the source of interference of any 50–60 hertz hum.

The output of the filter is then sent to one or more switches which select the pickup, or a combination of pickups, which are intended to drive the guitar's acoustic output. The output signal of the switches is preferably then sent to a low-noise pre-amplifier which adjusts the signal level produced by one or more pickups to a value suitable to be controlled by the audio processing controls. These controls alter the volume, and frequency response of the guitar's acoustic response by enhancing or reducing the frequency response in the bass, midrange, and treble portions of the audio spectrum.

The output of the audio processing controls is then sent either to an additional amplifier, to an output jack mounted on the face of the guitar, or to a wireless transmitter integrated into the printed circuit board itself. Numerous guitar wireless transmitters are known to those skilled in the art which enable a link between the guitar and the sound system including system amplifiers and speakers. However, it is preferred that the guitar of the present invention incorporates a transmitter operating in the VHF, UHF or upper band Ghz radio spectrums with either spread spectrum or frequency hopping type of modulation to avoid undesirable interference within the link between the instrument and sound system. Moreover, it is preferred that the printed circuit board include designated electrical contacts for connection to the wireless transmitter and for any power supply which needs to be connected to the wireless transmitter.

To further improve the sound quality of the guitar of the present invention, the deck plate circuit board is preferably constructed to have low inductance values, and capacitance values below 10 picofarads to compensate for the impedance of the pickup combinations. In a preferred embodiment, the printed circuit board includes six electrically conductive layers. From the front of the deck plate to the rear of the deck plate, these layers are identified as follows: 1) ground; 2) pickup signal to audio processing controls; 3) ground; 4) pickup signal to audio processing controls; 5) power; and 6) ground. Moreover, where the guitar includes an on-board integrated synthesizer (described below), preferably, the printed circuit board includes separated analog and digital signal path layers and ground planes to reduce noise by shielding the signal paths of separate guitar modes.

In an additional preferred aspect of the invention, the circuit board assembly incorporates a synthesizer circuit. The onboard synthesizer is connected to the output of the audio processing controls. The synthesizer receives the unaltered analog signal and implements band pass filtering, such as between 50 hertz and 4 kilohertz. The filtered analog signal is then converted to a digital format using an analog-to-digital converter sampling at a frequency of 10 kilohertz or 11.025 kilohertz. The notes produced by the guitar strings are detected using pitch detection algorithm methodology. Notes are then generated in digital format in accordance with Musical Instrument Digital Interface (MIDI), which is a known standard for connecting musical instruments, synthesizers and computers and which provides the capability to translate music into computer data, and vise versa. The notes in digital format are then altered using a program selection which can be determined by those skilled in the art. Preferably, the synthesizer programming includes capabilities for controlling tone generation and pitch generation as well as other parameters such as timbre, volume, dynamics and phase.

In a preferred embodiment, the synthesizer also includes the capabilities for adding additional harmonics into the audio production. Thus, when a fundamental note is detected, the synthesizer produces chords of corresponding harmonics for audio production. Once the digital signal has been altered to produce the desired audio production, the signal is fed to a digital-to-analog-converter (DAC) and is then sent to the guitar's output jack or wireless transmitter. For example, by integrating the synthesizer into the printed circuit board and passing the digital signal through a pitch detection algorithm analysis to detect notes, the guitar does not require the use of a phantom pickup which is required to convert traditional electric guitars to an electric guitar having a synthesizer.

Advantageously, the pickguard assembly of the present invention provides for significantly reduced noise and distortion. Wireless transmitters and synthesizers can also be integrated into the pickguard assembly. In addition, the incorporation of an integrated synthesizer into the printed circuit board eliminates the need for a dedicated phantom pickup for attachment to an electric guitar. Moreover, the pickguard assembly can be manufactured relatively inexpensively and provide for superior acoustic response compared to electric guitars available today.

Other features and advantages of the present invention will be appreciated by those skilled in the art upon reading the detailed description which follows with reference to the attached drawings.

DETAILED DESCRIPTION OF THE INVENTION

Figure 1:
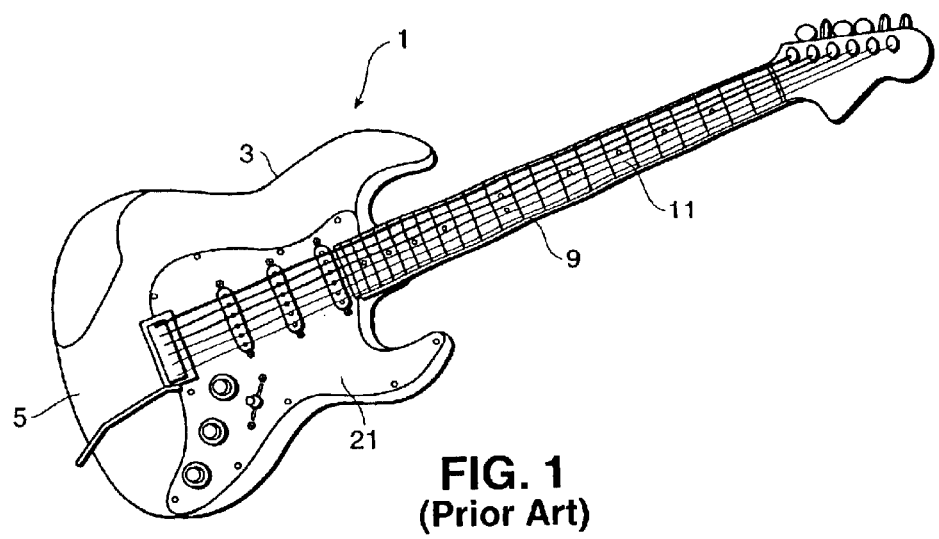
FIG. 1 is a perspective view showing a traditional guitar of the prior art.

While the present invention is susceptible of embodiment in various forms, there is shown in the drawings and will hereinafter be described the presently preferred embodiments of the invention with the understanding that the present disclosure is to be considered as exemplifications of the invention and it is not intended to limit the invention to the specific embodiments illustrated.

Figure 2:
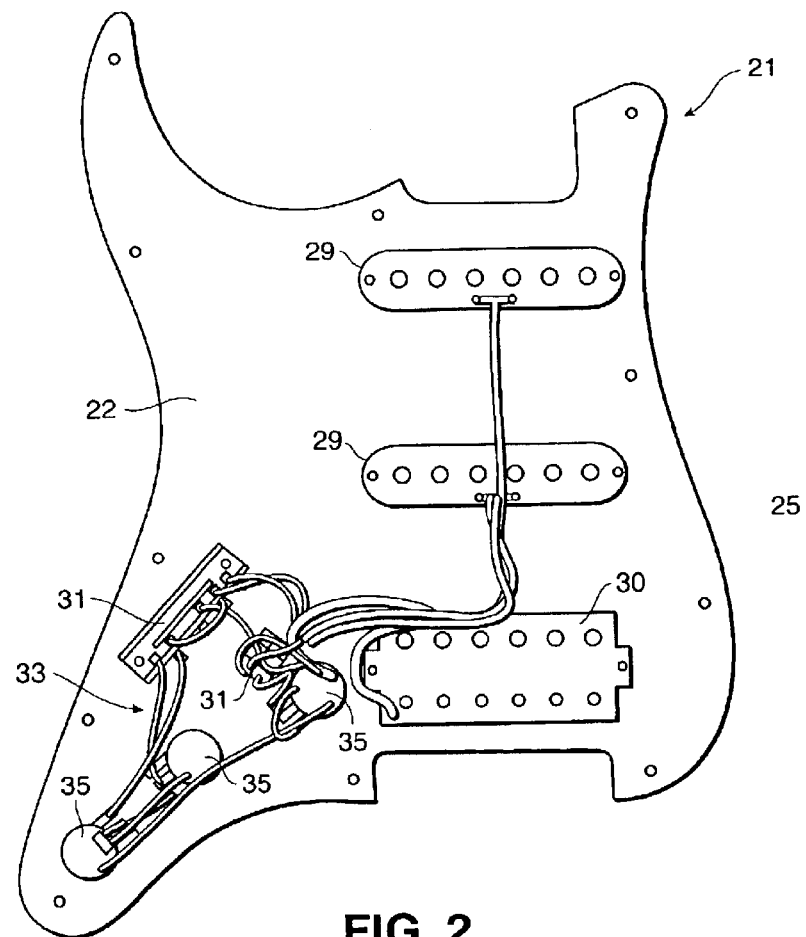
FIG. 2 is a rear plan view illustrating a pickguard assembly of the prior art.

As shown in FIGS. 1 and 2, a prior art electric guitar 1 including a body 3, a neck 9 and strings 11. In addition, many traditional electric guitars include a removable pickguard assembly 21 for mounting various electronic components of the electric guitar. As best shown in FIG. 2, a typical prior art pickguard assembly includes two standard pickups 29 and a humbucker pickup 30. In addition, the pickguard assembly 21 includes numerous switches 31 and processing controls 35 taking the form of various knobs or dials for controlling volume and tone. All of these components are connected by wires which are susceptible to the introduction of noise or other distortion effects.

With reference to FIGS. 3–6, the pickguard assembly 21 of the present invention virtually eliminates all individual wires 45. The pickguard assembly includes a deck plate 22 incorporating a printed circuit board 39. The deck plate 22 may be constructed of a traditional plastic or wood construction incorporating a printed circuit board mounted thereon. However, the preferred pickguard assembly of the present invention includes a printed circuit board 39 constructed in a shape to mount to the front of a guitar body, thus forming the deck plate itself.

Figure 3:
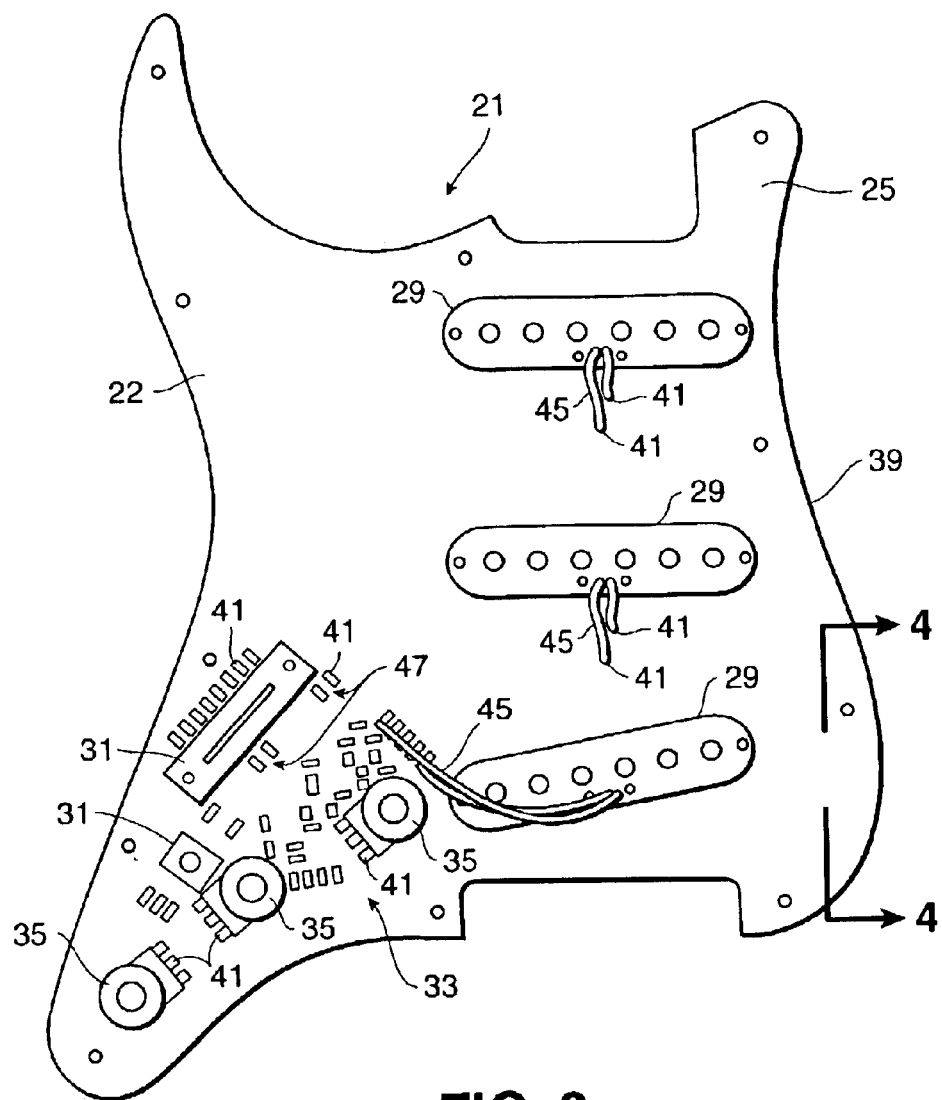
FIG. 3 is a rear plan view showing a pickguard assembly of the present invention.

The deck plate/circuit board of the present invention includes numerous holes for mounting the pickguard's electronic components. With reference to FIG. 3, the deck plate includes holes for mounting pickups 29, switches 31, and processing controls 35. The printed circuit board also includes numerous electrical contacts 41 for electrically connecting each of the electrical components to the printed circuit board. The components are connected to the electrical contacts by very short wires 45 or by electrical terminals (not shown) which project from the respective electrical component. For example, as shown in FIG. 3, the pickups 29 include very short wires 45 which attach to electrical contacts 41 formed on the back face 25 of the deck plate 22. The electrical contacts are positioned as close as possible to the pickups 29 to minimize the lengths of the wires 45. Moreover, preferably, the wires are shielded to reduce the introduction of noise or distortion into the acoustic response. The wires are attached to the electrical contacts by numerous means known to those skilled in the art including traditional soldering. Meanwhile, components having projecting electrical terminals, also referred to as leads, are attached to the printed circuit board by soldering or the like. Of course, attachment of the electrical components to the printed circuit board may be accomplished by wireless or leadless constructions such as wire bonding or tape automated bonding in which output contacts are arranged on the sides of the electrical components and then flow-soldered to the printed circuit board.

Figure 4:
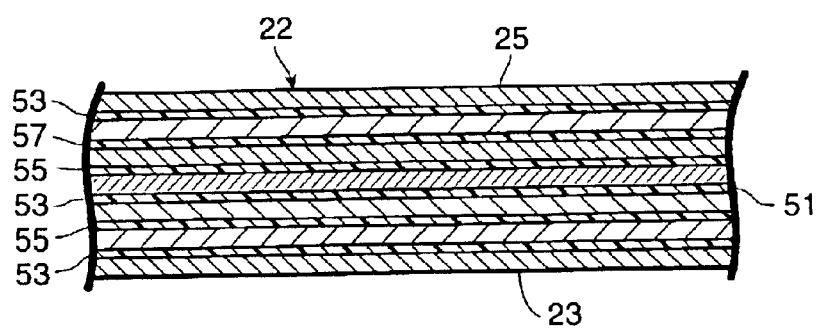
FIG. 4 is a side cutaway view illustrating the multiple layers of a preferred deck plate of the present invention.

Preferably, the printed circuit board is constructed to include at least six electrically conductive layers. With reference to FIG. 4, preferably, the layers 55 for transmitting signals are shielded by ground planes 53. In a preferred embodiment, the deck plate's printed circuit board is constructed with consecutive layers comprising 1) ground 53; 2) signal path 55; 3) ground 53; 4) signal path 55; 5) power 57; and 6) ground 53. Moreover, to provide the best possible quality of acoustic response, the circuit board is constructed to have low inductance values, and capacitance values of 10 picofarads or below.

Figure 5:
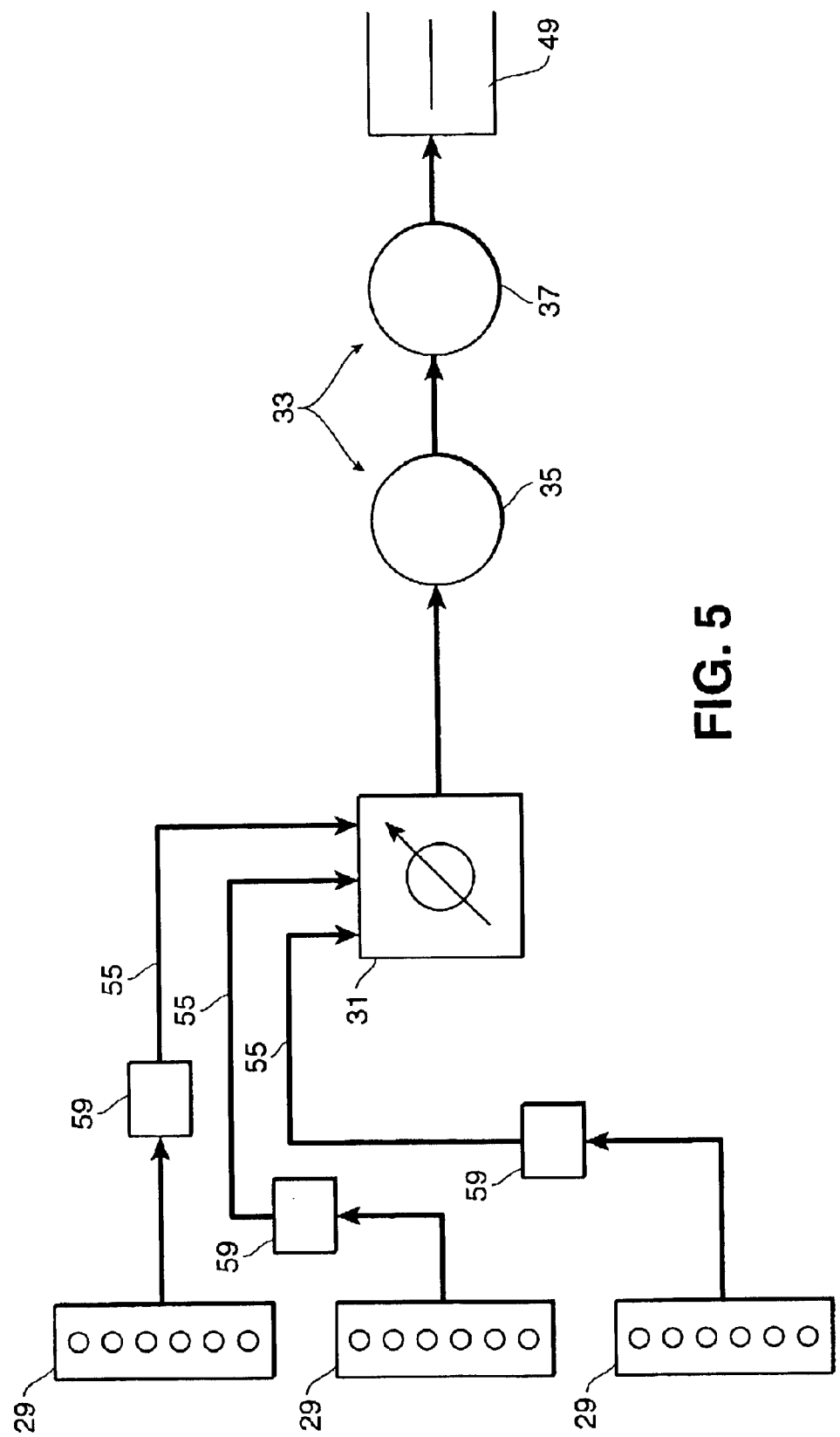
FIG. 5 is a simple block diagram illustrating the production of sound from an electric guitar.

With reference to FIG. 5, in operation, the electrical coils of the pickups 29 are affected by the vibration of the guitar strings in a magnetic field to produce an analog electrical output. This electrical output is transmitted through the short wires 45 to the printed circuit board electrical contacts 41. The analog signal is then transmitted through the signal paths 55 of the printed circuit board to a five position switch 31, and preferably, to an additional two position switch 31, which permits passage of the analog signal from one of the pickups, or combinations of pickups, to the guitar processing circuit 33. This processing circuitry, including tone control 35 and volume control 37, alters the qualities of the sound such as increasing or decreasing the volume of the acoustic response, or emphasizing or de-emphasizing various ranges of notes such as treble or bass. As shown in FIG. 5, preferably, the output analog signal of the pickup 29 passes through a notch filter 59 prior to reaching the one or more switches 31. The notch filter eliminates noise below 50–60 hertz to eliminate unwanted noise or hum. For a simplified guitar of the present invention, the analog signal produced by the processing circuit is then sent to the guitar's output 49. The output may be a traditional electrical connecter of an output jack, or a wireless transmitter which is preferably integrated into the deck plate's printed circuit board 39.

In a preferred embodiment of the invention, the guitar pickguard assembly 21 incorporates a synthesizer circuit (not shown) into the printed circuit board assembly. With reference to FIG. 5, the synthesizer is preferably connected in series in the electrical circuit between the processing circuit 33 and the output 49. The synthesizer may take various forms and constructions as can be determined by those skilled in the art. However, in a preferred embodiment of the invention, the synthesizer is not connected to an additional pickup, often referred to as a phantom pickup, as is typical in the prior art. Instead, the synthesizer of the present invention receives the unaltered analog signal selected by the pickup switches 31, and a band pass filter is implemented to allow passage of signals between 50 hertz and 4 kilohertz. The analog signal is then converted to a digital format using an analog-to-digital converter (ADC) operating at a frequency of 10 kilohertz or 11.025 kilohertz. Thereafter, the notes produced by the guitar strings are detected using pitch detection algorithm methodology which can be determined by those skilled in the art. Once the notes are detected, they are then generated in a digital format. Though there are numerous formats known to those skilled in the art, it is preferred that the notes be generated in the Musical Instrument Digital Interface (MIDI) format as it is a known and accepted standard for translating, storing and transmitting music. Once the notes are processed into a digital format, the synthesizer of the present invention permits alteration of the acoustic response by the guitar user. For example, it is preferred that the synthesizer include capabilities for controlling tone, pitch and timbre. Moreover, it is preferred that the synthesizer provide the capability of adding additional harmonics into the acoustic production. In particular, where the musician desires, it is preferred that the synthesizer, after detecting a fundamental note, produces chords of corresponding harmonics for acoustic production. Once the synthesizer has altered the digital signal, the signal is transmitted to a digital-to-analog converter (DAC). Once converted back to an analog format, the signal is sent to the guitar's output jack or to a wireless transmitter.

In addition to the pickguard assembly including an integrated synthesizer, in still an additional preferred embodiment of the invention, preferably, the pickguard assembly includes an integrated wireless transmitter. With reference to FIG. 3, the printed circuit board 39 forming the deck plate 22 includes electrical contacts 47 for attaching a wireless transmitter. The electrical contacts are provided for transmitting power and the audio signal from the printed circuit board to the wireless transmitter (not shown). Preferably, the wireless transmitter operates in the VHF or UHF radio spectrums with a spread spectrum CDMA type modulation to reduce interference between the guitar and the guitar sound system. In a first embodiment, the wireless transmitter converts an analog signal received from the pickguard processing circuitry or synthesizer circuitry into a digital format for radio transmission. Meanwhile, in an alternative embodiment, where the pickguard assembly includes an integrated synthesizer, the digital signal produced by the synthesizer is transmitted directly to the wireless transmitter in digital format, prior to analog-to-digital conversion. The digital signal produced by the synthesizer is then converted into a digital format suitable for RF transmission without requiring digital-to-analog and analog-to-digital conversions which are susceptible to information loss. Once transmitted to the music sound system, the digital RF signal is converted back into an analog signal for amplification and reproduction by the sound system's amplifiers and speakers.

Figure 6:
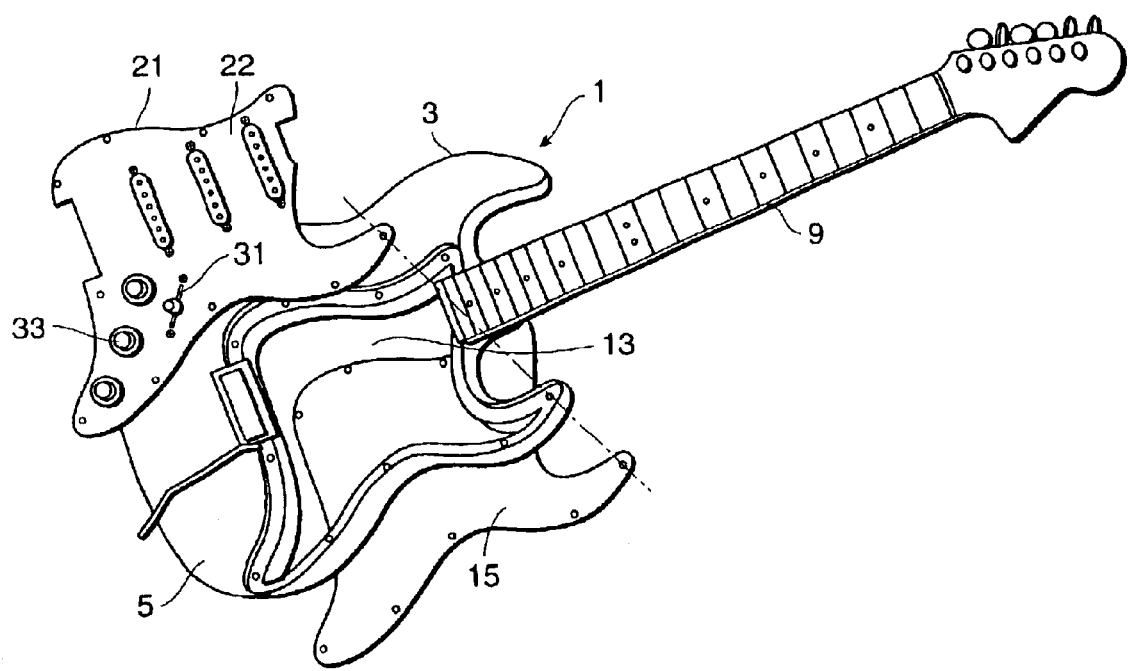
FIG. 6 is an exploded perspective view illustrating an electric guitar of the present invention wherein the guitar's body includes a bore projecting entirely through the guitar covered on the front by a pickguard assembly and the rear by a plate.

With reference to FIG. 6, in an additional aspect of the invention, an electric guitar 1 for use with the pickguard assembly of the present invention includes a hole which projects entirely through the guitar's body 3. The hole 13 forms open space for receipt of the pickguard's electronic components mounted on the deck plate's inside surface. The pickguard assembly 21 is attached to the guitar using screws, bolts or other traditional fasteners. Meanwhile, the guitar includes a back cover 15 for covering the rear of the hole 13. The back cover may also be attached to the guitar's body using screws, bolts or other fasteners. The provision of a hole which projects entirely through the guitar's body and a removable back cover enables a person to rapidly and easily access components within the guitar's interior, including the electrical components mounted to the back of the deck plate 22. Moreover, it has been found that this construction provides for an "acoustic" sound for the electric guitar. Moreover, though the back cover may be constructed of various materials such as wood, plexiglass, or other plastics, wood has been found to provide the preferred acoustic sound.

Although the guitar and pickguard assembly of the present invention have been described with reference to the preferred embodiments, workers skilled in the art will recognize that changes may be made in form and detail without departing from the spirit and scope of the invention.

We claim:

1. A stringed instrument pickguard assembly comprising:
   a deck plate constructed for mounting controls and one or more pickups and for attachment to the body of a stringed instrument;
   one or more pickups mounted on said deck plate;
   processing controls for controlling the audio produced by the stringed instrument;
   a multi-layer printed circuit board forming at least a portion of said deck plate, said printed circuit board including a plurality of electrically conductive layers connecting said attached pickups to said controls.

2. The pickguard assembly of claim 1 wherein said printed circuit board includes outer layer which are ground planes for shielding said electrical paths.

3. The pickguard assembly of claim 1 further including at least one notch filter electrically connected between one of said pickups and said processing circuitry.

4. A deck plate for a stringed instrument comprising:
   a multi-layered printed circuit board provided in the form of a deck plate for attachment to a stringed instrument, said printed circuit board including opening for attaching pickups, and electrical connections for connecting to processing controls for a controlling audio said printed circuit board further including plurality of conductive layers for connecting processing controls to said pickups.

5. The deck plate of claim 4 wherein said printed circuit board includes outer layers which are ground planes for shielding said electrical paths.

6. The deck plate of claim 4 further including at least one notch filter electrically connected between one of said pickups and said processing circuitry.

7. A stringed instrument pickguard assembly comprising:
   a deck plate constructed for one or more pickups and for attachment to the body of a stringed instrument;
   one or more pickups mounted on said deck plate;
   an output for producing a signal representative of the acoustic response of a stringed instrument;
   a multi-layered printed circuit board forming at least a portion of said deck plate, said printed circuit board including a plurality of electrical conductive layers for connecting said attached pickups to said output.

8. The stringed instrument pickguard assembly of claim 7 wherein said output is an electrical connector.

9. The stringed instrument pickguard assembly of claim 7 wherein said output is a wireless transmitter;
   an output for producing a signal representative of the acoustic response of a stringed instrument;
   a multi-layered printed circuit board forming at least a portion of said deck plate, said printed circuit board including electrical paths for transmitting signals from said attached pickups to said output.

* * * * *